(12) United States Patent
Kraynak (10) Patent No.: US 7,728,611 B1
(45) Date of Patent: Jun. 1, 2010

(54) COMPRESSIVE CONDUCTORS FOR SEMICONDUCTOR TESTING

(75) Inventor: Timothy L. Kraynak, Hatboro, PA (US)

(73) Assignee: Interconnect Devices, Inc., Kansas City, KS (US)

( * ) Notice: Subject to any disclaimer, the term of this patent is extended or adjusted under 35 U.S.C. 154(b) by 435 days.

(21) Appl. No.: 11/671,942

(22) Filed: Feb. 6, 2007

Related U.S. Application Data

(60) Provisional application No. 60/765,710, filed on Feb. 6, 2006.

(51) Int. Cl.
*G01R 31/02* (2006.01)
*H01R 13/24* (2006.01)

(52) U.S. Cl. ........................ 324/755; 439/824
(58) Field of Classification Search ........................ None
See application file for complete search history.

(56) References Cited

U.S. PATENT DOCUMENTS

| 6,634,890 | B2 * | 10/2003 | Peterson et al. ............... 439/67 |
| 6,758,682 | B1 * | 7/2004 | Kosmala ....................... 439/66 |
| 7,102,373 | B2 * | 9/2006 | Yoshida ....................... 324/755 |
| 7,279,913 | B2 * | 10/2007 | Wu et al. ..................... 324/754 |
| 7,297,004 | B1 * | 11/2007 | Shuhart et al. ................ 439/66 |
| 2008/0061809 | A1 * | 3/2008 | Lee et al. ..................... 324/761 |
| 2008/0143366 | A1 * | 6/2008 | Kurotori et al. ............. 324/761 |

* cited by examiner

*Primary Examiner*—Jermele M Hollington
(74) *Attorney, Agent, or Firm*—Pepper Hamilton, LLP (57) ABSTRACT

An interconnect assembly electrically connecting two circuit members, which include respective arrays of electrical contacts for engagement with the interconnect assembly. The interconnect assembly comprises a plurality of electrical conductors, the plurality of conductors arranged in a spaced arrangement, the spaced arrangement of the conductors substantially corresponding to a spaced arrangement for the respective arrays of electrical contacts to provide contact between the conductors and the contact arrays and a carrier, including a socket and a retainer. The socket includes a plurality of apertures each receiving an upper portion of one of the plurality of conductors and the retainer includes a plurality of apertures each receiving a lower portion of one of the plurality of conductors; and the respective apertures are aligned axially with each other.

4 Claims, 6 Drawing Sheets

COMPRESSIVE CONDUCTORS FOR SEMICONDUCTOR TESTING

RELATED APPLICATION DATA

This application claims the benefit of U.S. Provisional Application Ser. No. 60/765,710, filed 6 Feb. 2006.

FIELD OF INVENTION

The present invention relates to a temporary electrical contact for testing semiconductor package, and more specifically to a pogo pin device that provides low force and low contact resistance.

BACKGROUND OF THE INVENTION

A pogo pin is a device used in electronics to establish a (usually temporary) connection between two circuit members (e.g., printed circuit boards). The pogo pin usually takes the form of a slender cylinder containing two sharp, spring-loaded pins. Pressed between two electronic circuits, the sharp points at each end of the pogo pin make secure contacts with the two circuits and thereby connect them together.

Pogo pins are usually arranged in a dense array, connecting together many individual nodes of the two circuit boards. They are very commonly found in automatic test equipment in the form of a bed of nails, where they facilitate the rapid, reliable connection of the devices under test (DUTs).

When used in the high-performance applications, pogo pins must be very carefully designed to allow not only high reliability across many mating/unmating cycles but also high-fidelity transmission of the electrical signals. The pins themselves must be hard, yet plated with a substance (such as gold) that provides for reliable contact. Within the body of the pogo pin, the pins must make good electrical contact with the body. The design of pogo pins to be used in matched-impedance circuits is especially challenging; to maintain the correct characteristic impedance.

Therefore, it is desirable to provide a low force and low contact resistance pogo pin device for semiconductor testing.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. In the description, relative terms such as "horizontal," "vertical," "up," "down," "top," and "bottom" as well as derivatives thereof (e.g., "horizontally," "downwardly," "upwardly," etc.) should be construed to refer to the orientation as then described or as shown in the drawing figure under discussion unless otherwise specifically described. These relative terms are for convenience of description and normally are not intended to require a particular orientation. Terms "inwardly," "outwardly," "longitudinal" versus "lateral" and the like are to be interpreted relative to one another or relative to an axis of elongation, or an axis or center of rotation, as appropriate. Terms such as "connected" and "interconnected" refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. Included in the drawing are the following figures.

DETAILED DESCRIPTION OF THE DRAWINGS

As used herein, the term "collet" refers to a sleeve or the like having a cone-shaped or tapered end opening that may be adapted for engaging another piece at or adjacent the cone-shaped/tapered end.

Figure 4C:
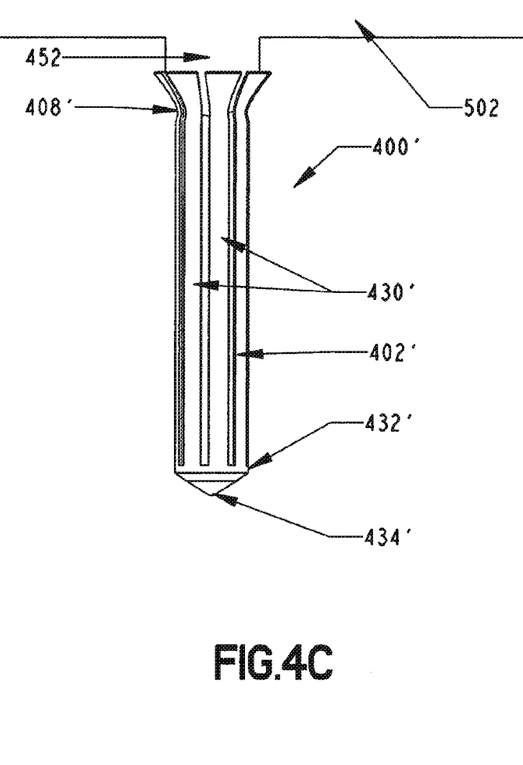
FIG. 4C is a side view of the direct contact collet assembly of FIG. 4A interengaged with a contact.
Figure 5:
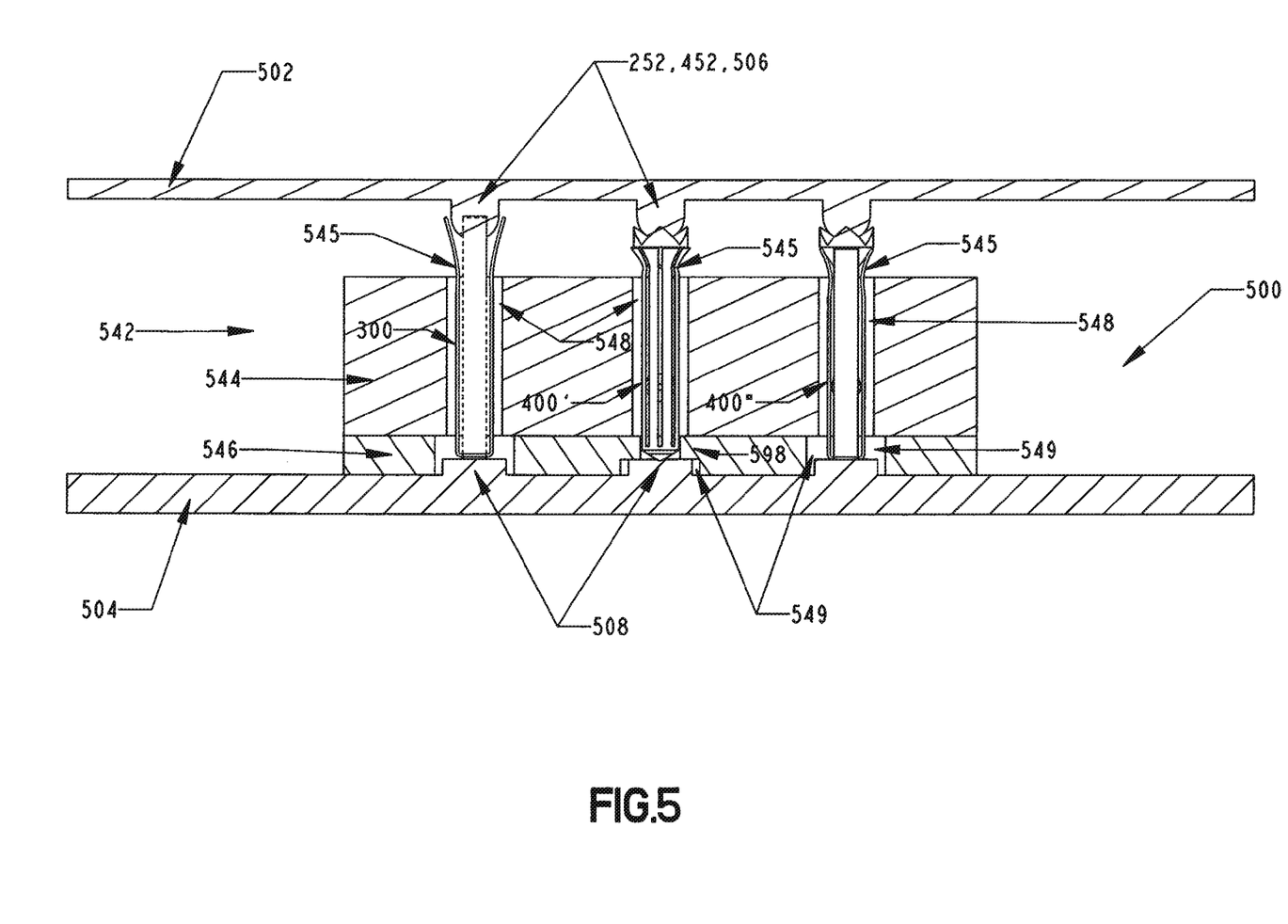
FIG. 5 is a side sectional view of an interconnect assembly according to an exemplary embodiment of the present invention shown electrically connecting circuit members having arrays of electrical contacts.

As illustrated in FIG. 5, all of the exemplary compressible connectors described herein (e.g., elements 100, 200, 300, 400', 400"), may be retained within carrier 542 of interconnect assembly 500 that electrically connects two circuit members 502, 504. According to one non-limiting example, circuit members 502, 504 are, respectively, upper semiconductor package 502 (also see, for example, FIGS. 2D and 4C) and load board 504 adapted for use with a package testing system. Package 502 and load board 504 include respective arrays of contacts 252, 452, 506 (also see, for example, FIGS. 2D and 4C) for engagement with interconnect assembly 500. It should be understood that the present invention is not limited to use with circuit members 502, 504 having electrical contacts of any particular configuration. The arrays of electrical contacts 252, 452, 506; 508 of respective circuit members 502; 504, for example, could comprise a land grid array, a ball grid array, or arrays of electrical contacts having other configurations. The contacts of upper circuit member 502 may also comprise input/output (I/O) pads or balls.

Such an interconnect assembly 500 includes a plurality of compressible connectors or the like 100, 200, 300, 400', 400" arranged in a spaced arrangement. The spaced arrangement of compressible connectors 100, 200, 300, 400', 400" substantially corresponds to a spaced arrangement for the electrical contacts 252, 452, 506; 508, respectively, of circuit members 502; 504. This arrangement provides for contact between compressible connectors 100, 200, 300, 400', 400" and the respective contact arrays of the circuit members 502; 504.

Figure 1A:
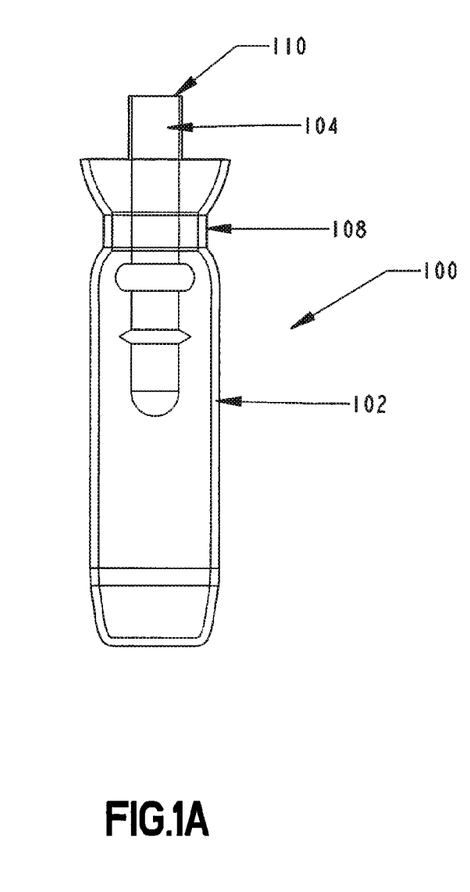
FIG. 1A is a side view of deep drawn spring pin according to an exemplary embodiment of the present invention.

As illustrated in FIG. 1A, in an exemplary embodiment of the present invention, compressible connector 100 includes electrical conductive housing 102 (having at least one deformation 108) adapted for receipt of electrically conductive plunger pin structure 104. It is noted that upper surface 110 of plunger pin structure 104 may be abrasive to facilitate electrical contact with an upper circuit member contact (not shown), for example being toothed or crowned (not shown), or may be roughened to achieve a rough surface. Further, upper surface 110 may be shaped to "scrub" contaminants (e.g., an oxide layer) from the surface of an electrical contact of the upper circuit member.

Figure 1B:
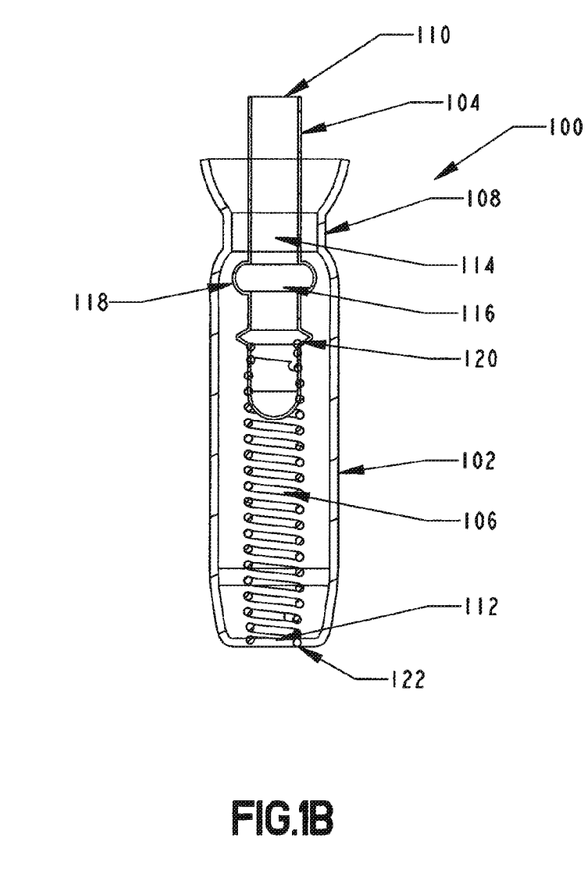
FIG. 1B is a partial cut-away view of FIG. 1A.

As illustrated in FIG. 1B, a partial cut-away view of FIG. 1A, plunger pin structure 104 includes lower circumferential flange-like structure or bead 116 that contacts upper surface 120 of electrically conductive underlying compressive member 106 (in the illustrated exemplary embodiment of FIG. 1B, a lower portion of plunger pin structure 104 is received by compressible member 106). Plunger pin structure 104 is retained within housing 102 by contact of upper circumferential flange-like structure or bead 114 against at least one deformation 108 of housing 102 to create interference 118 between plunger pin structure 104 and the interior of housing 102.

Opposing end 122 of compressive member 106 contacts lower interior surface 112 of housing 102 so that compressive member 106 biases upper circumferential flange-like structure 114 upwardly against deformation 108.

Compressible member 106 may be any type of spring member (e.g., a coiled spring) or the like as shown, for example in FIG. 1B, or may comprise a series of discrete, interlaced annealed wires forming a substantially tubular, lattice-like structure such as that disclosed in U.S. patent application Ser. No. 10/736,280, filed Dec. 15, 2003, which is incorporated herein by reference in its entirety.

Deformation 108 constricts the interior of housing 102 and may be a constriction, dimple or other deformation such as an interior flange such that deformation 108 interacts with plunger pin structure upper circumferential flange-like structure 114 as described above.

For example, housing 102 may be a deep drawn housing and deformation 108 may be a dimple formed by dimpling during formation of the deep drawn housing on a drawing die.

It is contemplated that deformation 108 could also be an interior deformation such as an interior flange or tab (not shown) adapted to engage upper circumferential flange-like structure 114 of plunger pin structure 104.

Compressible member 106 may be made from (or coated with) an electrically conductive material, such as, for example, gold-plated copper. Plunger pin structure 104 and housing 102 are also each made from (or coated with) an electrically conductive material (e.g., beryllium copper, Paliney® 7 (an alloy comprising palladium, gold and platinum and a registered trademark of The J. M. Ney Company, Ney Industrial Park 2 Douglas Street, Bloomfield, Conn. 06002), etc.). Alternatively, the plunger pin structure 104 and housing 102 could comprise a base material (e.g., beryllium copper, Paliney® 7, steel, copper, etc.) plated with a plating material such as gold or palladium cobalt, for example. In one specific exemplary embodiment, plunger pin structure 104 and housing 102 may comprise a beryllium copper base material plated with gold. Plunger pin structure 104 and compressible member 106 of compressible connector 100 are arranged, in the manner as described, such that an electrically conductive path is provided through compressible connector 100 and between upper and lower ends 120, 122 of compressible member 106 through plunger pin structure 104.

During the assembly of compressible connector 100, compressible member 106 may be inserted into housing 102 and plunger pin structure 104 may be snap-assembled into housing 102 positioning compressible member 106 at the bottom of housing 102, forcing circumferential flange-like structure 114 of plunger pin structure 104 toward deformation 108 to retain plunger pin structure 104 within housing 102. As noted above, lower circumferential flange-like structure 116 engages upper surface 120 of compressible member 106 so that compressible member 106 biases upper circumferential flange-like structure 114 upwards against deformation 108. An electrically conductive path may be thus provided from the bottom of electrically conductive housing 102 through its interior bottom surface 112 through compressible member 106 and through plunger pin structure 104.

It is also noted that in this relaxed but biased state, an electrically conductive path may also be traced from housing 102 through deformation 108 and through plunger pin structure 104. However, when compressible connector (e.g., pogo pin) 100 contacts an upper circuit member contact (not shown), the contact interengages upper surface 110 of plunger pin structure 104, pressing down upon and compressing compressible member 106 and urging upper circumferential flange-like structure 114 below deformation 108 such that upper circumferential flange-like structure 114 may disengage from deformation 108. Thus, the electrically conductive path from the bottom of electrically conductive housing 102 (contacting the lower circuit member contact (not shown)) through its interior bottom surface 112 through compressible member 106 and through plunger pin structure 104 may be utilized to provide an electrical connection from the lower circuit member contact to the respective upper circuit member contact.

It is noted that compressible connector 100 illustrated in FIGS. 1A and 1B uses deep drawn tubing/housing 102 that may form tapers, beads and dimples all in a single step which form interlocking surfaces utilized during assembly of compressible connector 100. Compressible connector 100 so formed may be a low force, low impedance force, temporary electrically contact.

Figure 2A:
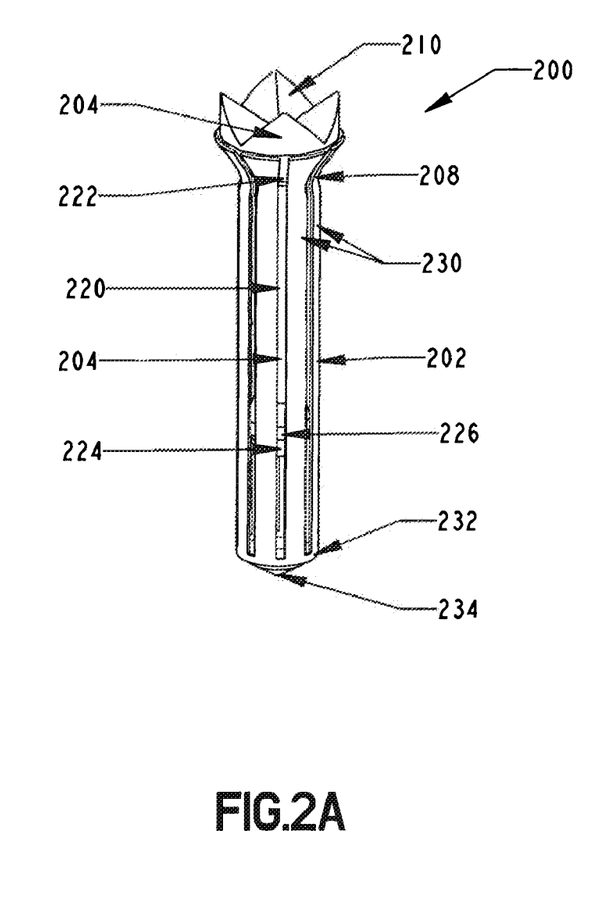
FIG. 2A is a perspective view of a collet spring pin according to an exemplary embodiment of the present invention.
Figure 2B:
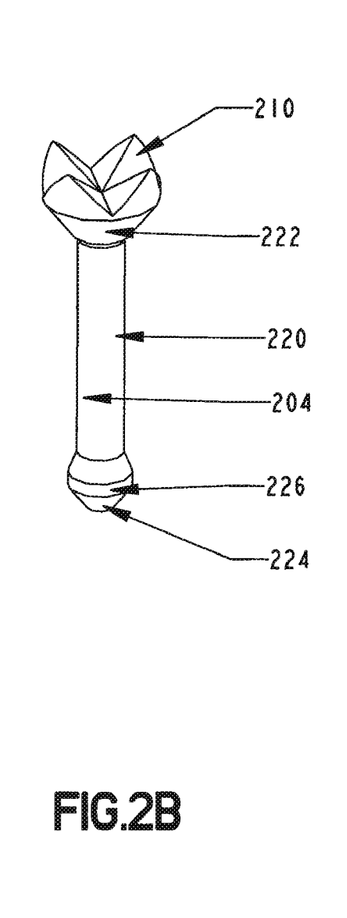
FIG. 2B is a perspective view of the plunger member illustrated in FIG. 2A.
Figure 2C:
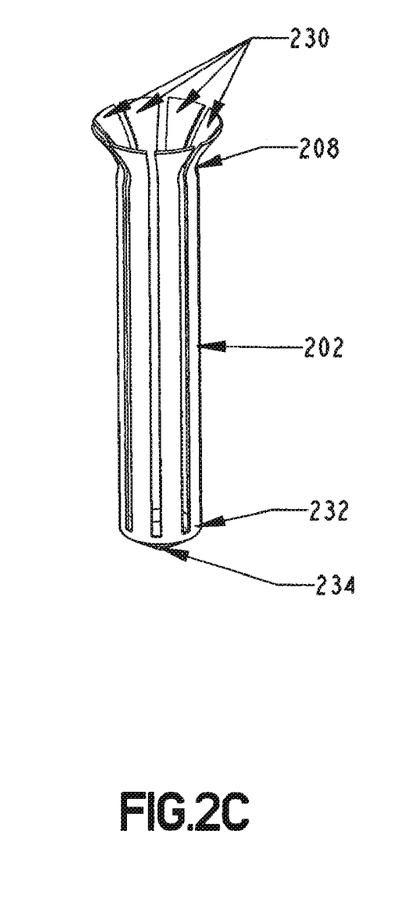
FIG. 2C is a perspective view of collet housing illustrated in FIG. 2A.
Figure 2D:
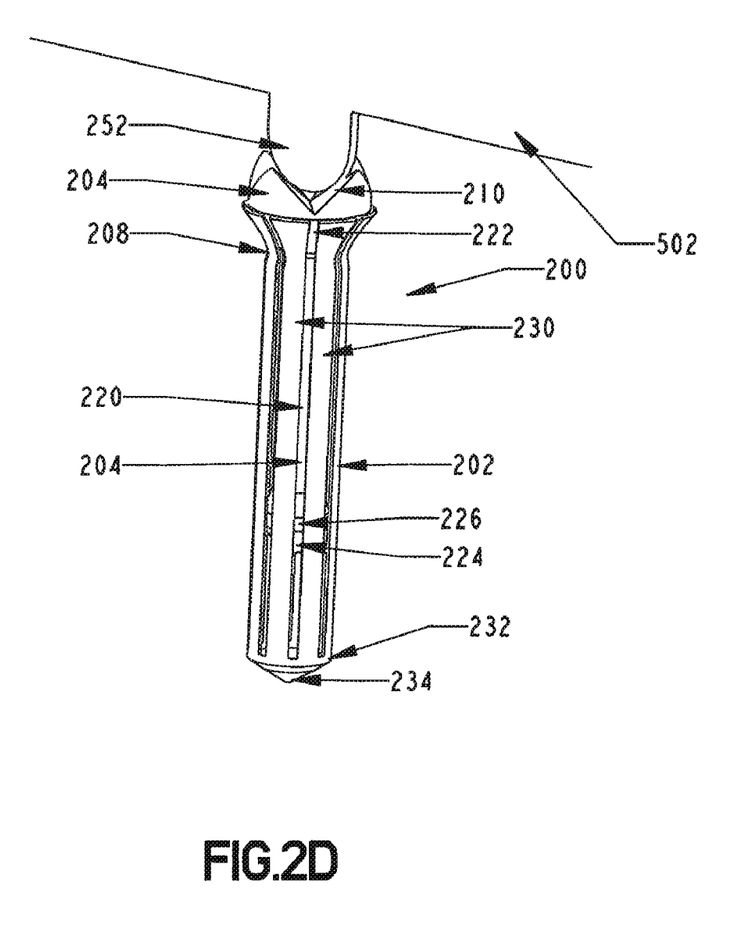
FIG. 2D is a partial cut-away perspective view of the collet spring pin of FIG. 2A interengaged with a contact.

As illustrated in FIGS. 2A and 2D (the assembly 200 of FIG. 2A interengaged with a contact 252), in another exemplary compressible connector according to the present invention, collet spring pin assembly 200 includes electrically conductive housing 202 adapted for receipt of electrically conductive plunger pin structure 204. Upper surface 210 of plunger pin structure 204 may be abrasive to facilitate electrical contact with upper circuit member 502 contact 252 (see, for example, FIG. 2D), being toothed or crowned as shown in FIGS. 2A, 2B and 2D, for example, and/or may be roughened to achieve a rough surface. Lower surface 234 of lower housing portion 232 is tapered as shown in FIGS. 2A, 2C and 2D, for example, and/or abrasive to facilitate electrical contact with a lower circuit member contact (not shown).

As illustrated in FIGS. 2A, 2B and 2D, for example, plunger pin structure 204 includes elongated body portion 220 with upper enlarged portion 222 and lower enlarged, bulbous portion 224 having band 226.

As illustrated in FIGS. 2A, 2C and 2D, for example, housing 202 may be comprised of adjacent, roughly parallel beams or tongs 230 extending from lower housing portion 232. Beams/tongs 230 may function as beam springs, for example, as described below. While eight beams/tongs 230 are illustrated in FIGS. 2A and 2C, more or less beams/tongs 230 may be employed.

Deformation 208 may be formed at the upper end of housing 202 from the beams/tongs 230. Such deformation 208 may be comprised of respective inwardly deformed portions of the beams/tongs 230 as shown in FIGS. 2A, 2C and 2D, for example, or may be comprised of another deformation such that deformation 208 interacts with lower bulbous portion 224 and upper enlarged portion 222 of plunger pin structure 204 upon assembly of collet spring pin assembly 200 such that: (1) lower bulbous portion 224/band 226 may be forced past deformation 208 to assist in retaining plunger pin structure 204 within housing 202; and (2) upper enlarged portion 222 may interengage with deformation 208 during contact with upper circuit member 502 contact 252 (see, for example, FIG. 2D) to bias upper surface 210 of plunger pin structure 204 against contact 252 and to ensure an electrically conductive path from bottom surface 234 of housing 202 (contacting a lower circuit member contact (not shown)) through one or more beams/tongs 230 and through upper enlarged portion 222 to upper circuit member 502 contact 252.

Plunger pin structure 204 and housing 202 may each be made from (or coated with) an electrically conductive material (e.g., beryllium copper, Paliney® 7 (an alloy comprising palladium, gold and platinum and a registered trademark of The J. M. Ney Company, Ney Industrial Park 2 Douglas Street, Bloomfield, Conn. 06002), etc.). Alternatively, plunger pin structure 204 and housing 202 may comprise a base material (e.g., beryllium copper, Paliney® 7, steel, copper) plated with a plating material such as gold or palladium cobalt, for example. For example, plunger pin structure 204 and housing 202 may comprise a beryllium copper base material plated with gold. As noted above, plunger pin structure 204 and housing 202 of collet spring pin assembly 200 may be arranged, in the manner as described, such that an electrically conductive path may be provided through collet spring pin assembly 200 from lower surface 234 of housing 202 through one or more tongs 230 through upper enlarged portion 222 of plunger pin structure 104 and through its upper surface 210.

It is noted that lower bulbous portion 224/band 226 may also have a slight interference fit within housing 202 to further assist retention of plunger pin structure 204 within housing 202.

As illustrated in FIG. 2D, for example, when spring pin assembly 200 contacts upper circuit member contact 252, contact 252 interengages upper surface 210 of plunger pin structure 204, so that upper enlarged portion 222 of plunger pin structure 204 presses down against deformation 208, tending to spread tongs 230 apart. Thus, the electrically conductive path from bottom surface 234 of electrically conductive housing 202 (contacting the lower circuit member contact (not shown)) through one or more beams/tongs 230, through upper enlarged portion 222 (and may also be through band 226 of the lower bulbous portion 224) and through plunger pin structure 204 may be utilized to provide an electrical connection from the lower circuit member contact to the respective upper circuit member 502 contact 252.

Upon release of collet spring pin assembly 200 from upper circuit member contact 252, deformation 208 formed by tongs 230 may tend to contract, urging upper enlarged portion 222 of plunger pin structure 204, and thus plunger pin structure 204, upwardly, ready to contact (another) upper circuit member 502 contact 252. Thus, deformation 208 formed from beams/tongs 230 of housing 202 may serve as a spring/ spring action vis a vis plunger pin structure 204/upper enlarged portion 222.

Each tong 230 may have a relatively low stiffness and exerts a low force of, for example, from about 1 to 3 grams to radially spring plunger pin structure 204 upwardly, away from housing 202 due to the inclined mating surfaces of deformation 208 at the upper end of housing 202 as described herein. The use of a collet provides spring forces (with beams/ tongs 230 acting as beam springs, for example) as described herein and also low electrical resistance paths through each tong 230 of collet housing 202.

Figures 3A, 3B:
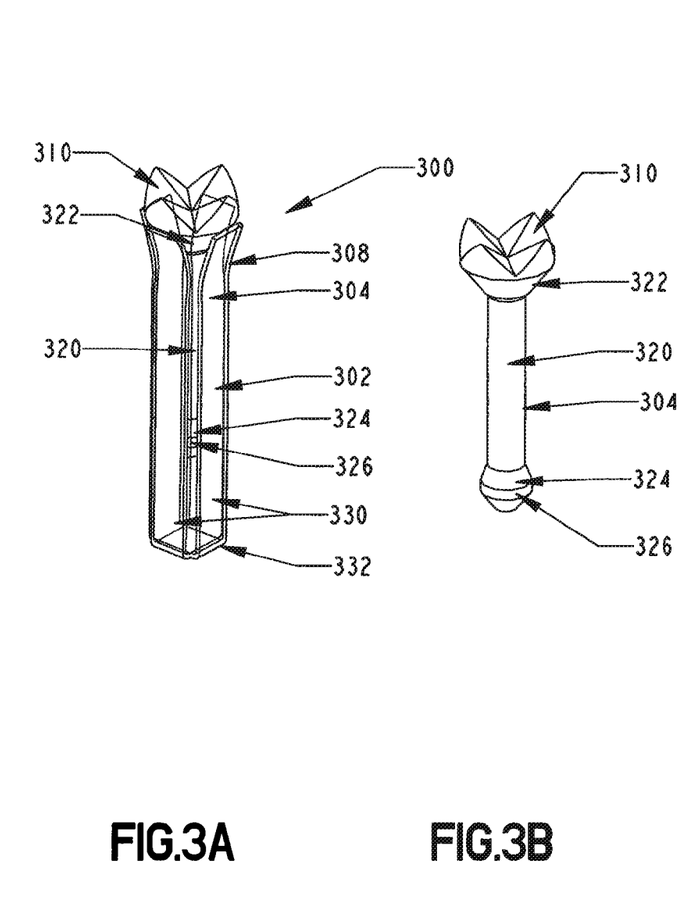
FIG. 3A is a perspective view of a collet spring pin according to another exemplary embodiment of the present invention.
FIG. 3B is a perspective view of the plunger member illustrated in FIG. 3A.
Figures 3C, 3D:
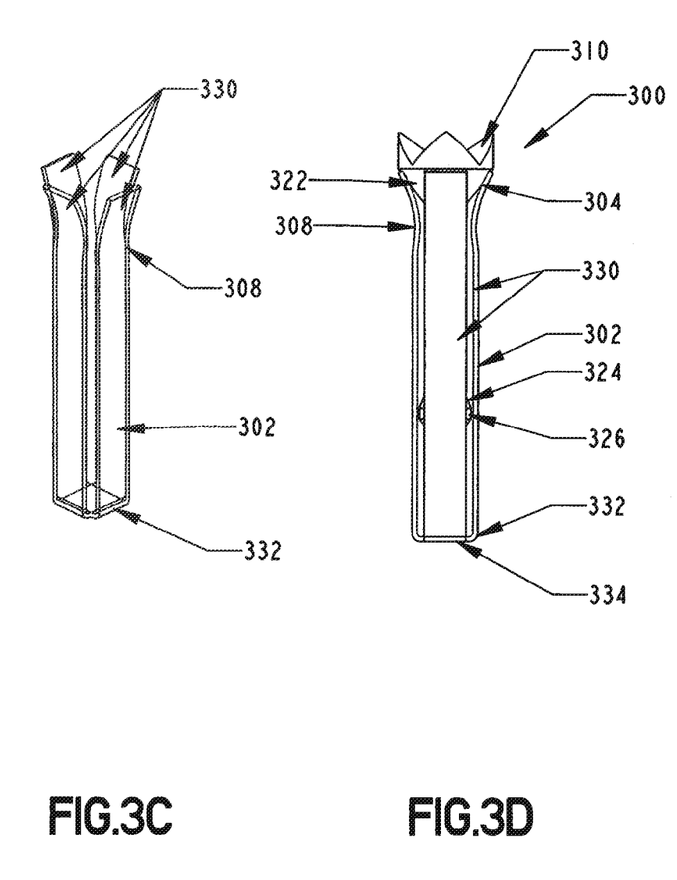
FIG. 3C is a perspective view of collet housing illustrated in FIG. 3A.
FIG. 3D is a perspective view of FIG. 3A rotated approximately 45°.

As illustrated in FIG. 3A, in yet another exemplary compressible connector according to the present invention, stamped collet spring pin assembly 300 includes stamped, electrically conductive housing 302 adapted for receipt of electrically conductive plunger pin structure 304. Upper surface 310 of plunger pin structure 304 may be abrasive to facilitate electrical contact with an upper circuit member contact (not shown but analogous to FIG. 2D, for example), for example being toothed or crowned as shown in FIGS. 3A, 3B and 3D (the assembly 300 of FIG. 3A rotated 45°), for example, and/or may be roughened to achieve a rough surface. It is noted that this exemplary embodiment is analogous to the exemplary embodiment described above and illustrated in FIGS. 2A, 2B, 2C and 2D, for example, except that in this exemplary embodiment, housing 302/tongs 330 are formed by a stamping process (although other processes are contemplated).

As illustrated in FIGS. 3A, 3B and 3D, for example, plunger pin structure 304 includes elongated body portion 320 with upper enlarged portion 322 and lower enlarged, bulbous portion 324 having band 326.

As illustrated in FIGS. 3A, 3C and 3D, for example, stamped housing 302 is comprised of adjacent, roughly parallel stamped beams or tongs 330 extending from lower housing portion 332. Beams/tongs 330 may function as beam springs, for example, as described below. While four beams/ tongs 330 are illustrated in FIGS. 3A, 3C and 3D, more or less tongs 330 may be employed.

Deformation 308 is formed at the upper end of housing 302 from tongs 330. Such deformation 308 may be comprised of respective inwardly deformed portions of the beams/tongs 330, for example, or may be comprised of another deformation such that deformation 308 interacts with lower bulbous portion 324 and upper enlarged portion 322 of plunger pin structure 304 upon assembly of the stamped collet spring pin assembly 300 such that: (1) lower bulbous portion 324/band 326 may be forced past deformation 308 to assist in retaining plunger pin structure 304 within stamped housing 302; and (2) upper enlarged portion 322 interengages with deformation 308 during contact with an upper circuit member contact (not shown but again analogous to FIG. 2D, for example) to bias upper surface 310 of plunger pin structure 304 against the contact and to ensure an electrically conductive path from bottom surface 334 of stamped housing 302 (contacting a lower circuit member contact (not shown)) through one or more stamped tongs 330 and through upper enlarged portion 322 to the upper circuit member contact.

Plunger pin structure 304 and stamped housing 302 may each be made from (or coated with) an electrically conductive material (e.g., beryllium copper, Paliney® 7 (an alloy comprising palladium, gold and platinum and a registered trademark of The J. M. Ney Company, Ney Industrial Park 2 Douglas Street, Bloomfield, Conn. 06002), etc.). Alternatively, the plunger pin structure 304 and stamped housing 302 may comprise a base material (e.g., beryllium copper, Paliney® 7, steel, copper) plated with a plating material such as gold or palladium cobalt, for example. According to a specific example, the plunger pin structure 304 and stamped housing 302 may comprise a beryllium copper base material plated with gold. As noted above, plunger pin structure 304 and stamped housing 302 of collet spring pin assembly 300 may be arranged, in the manner as described, such that an electrically conductive path may be provided through collet spring pin assembly 200 from lower surface 334 of stamped housing 302 through one or more stamped tongs 330 through upper enlarged portion 322 of plunger pin structure 304 and through its upper surface 310.

It is noted that lower bulbous portion 324/band 326 may also have a slight interference fit within stamped housing 302 to further assist retention of plunger pin structure 304 within stamped housing 302.

When spring pin assembly (pogo pin) 300 contacts an upper circuit member contact (not shown but analogous to FIG. 2D, for example), the contact interengages upper surface 310 of plunger pin structure 304, so that upper enlarged portion 322 of plunger pin structure 304 presses down against deformation 308, tending to spread stamped tongs 330 apart. Thus, the electrically conductive path from bottom surface 334 of electrically conductive stamped housing 302 (contacting the lower circuit member contact (not shown)) through one or more stamped tongs 330, through upper enlarged portion 322 (and may also be through band 326 of lower bulbous portion 324) and through plunger pin structure 304 may be utilized to provide an electrically connection from the lower circuit member contact to the respective upper circuit member contact.

Upon release of the collet spring pin assembly 300 from the upper circuit member contact, deformation 308 formed by the stamped tongs 330 may tend to contract, urging upper enlarged portion 322 of plunger pin structure 304, and thus plunger pin structure 304, upwardly ready to contact the/another upper circuit member contact.

Thus, deformation 308 formed from stamped tongs 330 of the stamped housing 302 may serve as a spring/spring action vis a vis plunger pin structure 304/upper enlarged portion 322.

Each stamped tong 330 may have a relatively low stiffness and may exert a low force of, for example, from about 1 to 3 grams to radially spring plunger pin structure 304 upwardly, away from stamped housing 302 due to the inclined mating surfaces of deformation 308 at the upper end of stamped housing 302 as described herein. The use of a collet provides spring forces (with beams/tongs 330 acting as beam springs, for example) as described herein and also low electrical resistance paths through each stamped tong 330 of stamped collet housing 302.

Figure 4A:
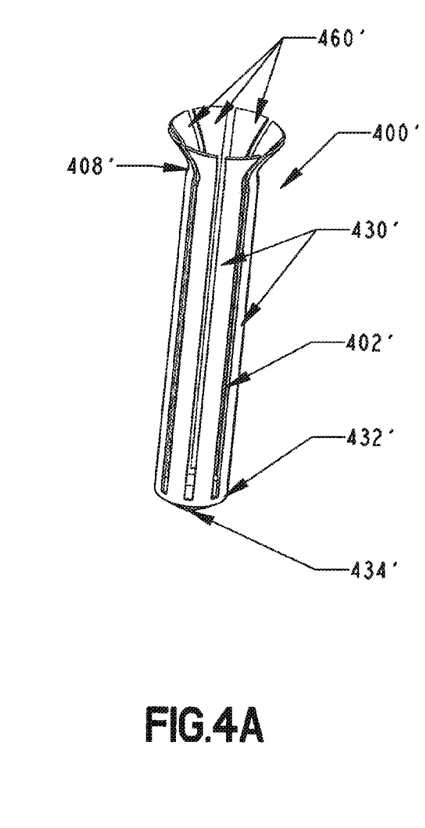
FIG. 4A is a perspective view of a direct contact collet assembly according to an exemplary embodiment of the present invention.
Figure 4B:
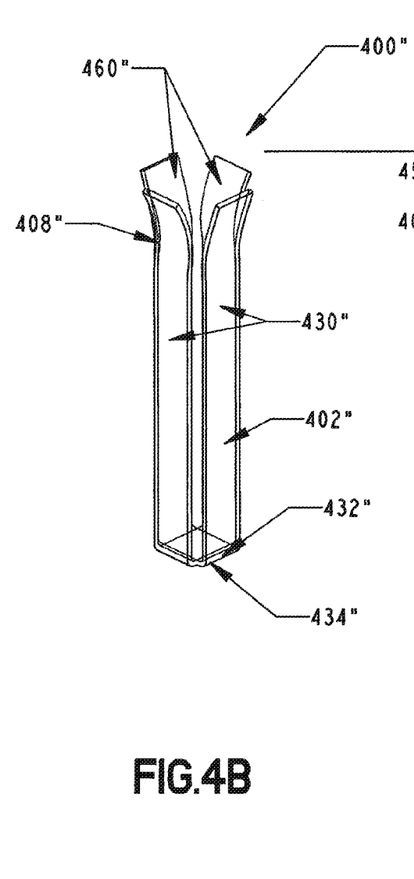
FIG. 4B is a perspective view of a direct contact collet assembly according to another further exemplary embodiment of the present invention.

As illustrated in FIGS. 4A and 4C, in another exemplary embodiment of the present invention, direct contact collet spring assembly 400' comprises electrically conductive housing 402' comprised of adjacent, roughly parallel beams or tongs 430' extending from lower housing portion 432'. Beams/tongs 430' may function as beam springs, for example, as described below. While eight beams/tongs 430' are illustrated in FIGS. 4A and 4C, for example, more or less beams/tongs 430' may be employed.

Lower surface 434' of lower housing portion 432' may be tapered as shown in FIGS. 4A and 4C, for example, and/or abrasive to facilitate electrical contact with a lower circuit member contact (not shown).

Deformation 408' is formed at the upper end of housing 402' from tongs 430'. Such deformation 408' is comprised of respective inwardly deformed portions of tongs 430' as shown in FIGS. 4A and 4C, for example, or may be comprised of another deformation such that deformation 408' interacts with upper circuit member 502 contact 452 (see FIG. 4C, for example) to bias interior surfaces 460' of respective tongs 430' against contact 452 and to ensure an electrically conductive path from bottom surface 434' of housing 402' (contacting a lower circuit member contact (not shown)) through one or more tongs 430' to upper circuit member 502 contact 452.

Housing 402' may be made from (or coated with) an electrically conductive material (e.g., beryllium copper, Paliney® 7 (an alloy comprising palladium, gold and platinum and a registered trademark of The J. M. Ney Company, Ney Industrial Park 2 Douglas Street, Bloomfield, Conn. 06002), etc.). Alternatively, housing 402' may comprise a base material (e.g., beryllium copper, Paliney® 7, steel, copper, etc.) plated with a plating material such as gold or palladium cobalt, for example. For example, housing 402' may comprise a beryllium copper base material plated with gold. As noted above, housing 402' of the direct contact collet spring pin assembly 400' may provide for an electrically conductive path through direct contact collet spring pin assembly 400' from lower surface 434' of housing 402' through one or more tongs 430' and through their respective interior surfaces 460'.

As illustrated in FIG. 4C, for example, when direct contact collet spring assembly 400' contacts upper circuit member contact 452, contact 452 interengages interior surface(s) 460' of at least one tong 430', so that contact 452 presses down against deformation 408', tending to spread tongs 430' apart. Thus, the electrically conductive path from bottom surface 434 of electrically conductive housing 402' (contacting the lower circuit member contact (not shown)) through one or more tongs 430' and through the interior surface(s) of one or more respective tongs 430' may be utilized to provide an electrically connection from the lower circuit member contact to the respective upper circuit member 502 contact 452.

Upon release of direct contact collet spring assembly 400' from upper circuit member contact 452, deformation 408' formed by tongs 430' may tend to contract, ready to contact the/another upper circuit member 502 contact 452.

Thus, deformation 408' formed from beams/tongs 430' of housing 402' may serve as a spring/spring action.

Each tong 430' may have a relatively low stiffness and may exert a low force of, for example, from about 1 to 3 grams to radially spring against upper circuit member contact 452 up and away from housing 402' due to the inclined mating surfaces of deformation 408' at the upper end of housing 402' as described herein. The use of a collet provides spring forces (with beams/tongs 430' acting as beam springs, for example) as described herein and also low electrical resistance paths through each tong 430' of collet housing 402'.

As illustrated in FIG. 4B, in yet another exemplary embodiment of the present invention, direct contact stamped collet spring assembly 400" comprises electrically conductive stamped housing 402" comprised of adjacent, roughly parallel stamped beams or tongs 430" extending from lower housing portion 432". Beams/tongs 430" may function as beam springs, for example, as described below. While four beams/tongs 430" are illustrated in FIG. 4B, for example, more or less beams/tongs 430" may be employed.

Lower surface 434" of lower housing portion 432" may be adapted for electrical contact with a lower circuit member contact (not shown). It is noted that this exemplary embodiment is analogous to the exemplary embodiment described above and illustrated in FIGS. 4A and 4C, for example, except that in this exemplary embodiment, housing 402"/tongs 430" are formed by a stamping process.

Deformation 408" is formed at the upper end of stamped housing 402" from stamped tongs 430". Such deformation 408" may be comprised of respective inwardly deformed portions of stamped beams/tongs 430" as shown in FIG. 4B, for example, or may be comprised of another deformation such that deformation 408" may interact with an upper circuit member contact (not shown but analogous to FIG. 4C, for example) to bias interior surfaces 460" of respective stamped tongs 430" against the contact and to ensure an electrically conductive path from bottom surface 434' of housing 402' (contacting a lower circuit member contact (not shown)) through one or more stamped tongs 430" to the upper circuit member contact.

Stamped housing 402" may be made from (or coated with) an electrically conductive material (e.g., beryllium copper, Paliney® 7 (an alloy comprising palladium, gold and platinum and a registered trademark of The J. M. Ney Company, Ney Industrial Park 2 Douglas Street, Bloomfield, Conn. 06002), etc.)). Alternatively, stamped housing 402" may comprise a base material (e.g., beryllium copper, Paliney® 7, steel, copper, etc.) plated with a plating material such as gold or palladium cobalt, for example. For example, the stamped housing 402" may comprise a beryllium copper base material plated with gold. As noted above, stamped housing 402" of direct contact stamped collet spring pin assembly 400" may provide for an electrically conductive path through direct contact stamped collet spring pin assembly 400" from lower surface 434" of stamped housing 402" through one or more stamped tongs 430" and through their respective interior surfaces 460".

When direct contact stamped collet spring assembly 400" contacts an upper circuit member contact (not shown but again analogous to FIG. 4C, for example), the contact may interengage interior surface(s) 460" of at least one stamped tong 430", so that the contact presses down against deformation 408", tending to spread stamped tongs 430" apart. Thus, the electrically conductive path from bottom surface 434" of electrically conductive stamped housing 402" (contacting the lower circuit member contact (not shown)) through one or more stamped tongs 430" and through the interior surface(s) of one or more respective stamped tongs 430" may be utilized to provide an electrically connection from the lower circuit member contact to the respective upper circuit member contact.

Upon release of direct contact stamped collet spring assembly 400" from the upper circuit member contact, deformation 408" formed by stamped tongs 430" may tend to contract, ready to contact the/another upper circuit member contact (again).

Thus, deformation 408" formed from stamped tongs 430" of stamped housing 402" may serve as a spring/spring action.

Each stamped tong 430" may have a relatively low stiffness and may exert a low force of, for example, from about 1 to 3 grams to radially spring against the upper circuit member contact up and away from stamped housing 402" due to the inclined mating surfaces of deformation 408" at the upper end of stamped housing 402"' as described herein. The use of a collet provides spring forces (with beams/tongs 430" acting as beam springs, for example) as described herein, and also low electrical resistance paths through each stamped tong 430" of the stamped collet housing 402".

Referring to FIG. 5, according to another exemplary embodiment of the invention, interconnect assembly 500 is shown electrically connecting two circuit members 502, 504. According to one non-limiting example, circuit members 502, 504 may be, respectively, semiconductor package 502 and load board 504 adapted for use with a package testing system. Package 502 and load board 504 include respective arrays of contacts 252, 452, 506; 508 for engagement with interconnect assembly 500, as described below in greater detail. It should be understood that the present invention is not limited to use with circuit members having electrical contacts of any particular configuration. The arrays of electrical contacts of circuit members 502, 504, for example, may comprise, respectively, a ball grid array of contacts 252, 452, 506 and a land grid array of contacts 508, or arrays of electrical contacts having other configurations.

Interconnect assembly 500 may include a plurality of electrical conductors 300 (see FIG. 3D, a perspective view, for example), 400' (see FIG. 4C, a side view, for example), 400" (see FIG. 4B, a side view, for example) arranged in a spaced arrangement. The spaced arrangement of conductors 300, 400', 400" may substantially correspond to the spaced arrangement for electrical contacts (252), 452, 506; 508, respectively, of circuit members 502, 504. This arrangement may provide for contact between conductors 300, 400', 400" and contact arrays (252), 452, 506; 508 of circuit members 502, 504, as illustrated in FIG. 5, for example.

It is noted that first, second and third electrical conductors 300, 400', 400" illustrated in FIG. 5 may each be according to a separate exemplary embodiment of the present invention and are illustrated on the same interconnect assembly 500 for convenience and while is it contemplated that different embodied electrical conductors may be assembled in a single such interconnect assembly 500, only one type exemplary embodiment conductor may comprise each conductor 300, 400', 400". Electrical conductors 300, 400', 400" may be referred to herein as "first (electrical) conductor 300," "second (electrical) conductor 400' " and "third (electrical) conductor 400"," respectively. This is only for the purposes of ease of description and understanding.

As shown in FIG. 5, for example, socket member 544 of carrier 542 defines a plurality of apertures 548 each receiving an upper portion of one conductor 300, 400', 400". Retainer 546 of carrier 542 defines a plurality of apertures 549 each receiving a lower portion of one conductor 300, 400', 400". Respective apertures 548, 549 of socket member 544 and retainer 546 of carrier 542 are substantially aligned, axially, with each other.

Apertures 548 of socket member 544 may define respective upper shoulders 545 to assist in retaining conductors 300, 400', 400" (for example proximate their respective deformations 308, 408', 408") within apertures 548 while permitting: (1) the upper end of tongs 330 to flex, or be biased against, the upper enlarged portion 322 of plunger pin structure 304 when engaging/engaged/disengaging with package 502; and (2) the respective interior surfaces 460', 460" of the upper ends of housings 402', 402" to flex, or be biased, against contacts 452, 506 when engaging/engaged/disengaging with package 502. Further, respective aperture 549 of retainer 546 may define a lower shoulder 598 to assist in retaining conductor 400' within apertures 548, 549.

As shown in FIG. 5, for example, apertures 548 of socket member 544 of carrier 542 may have a diameter that may be roughly equal to, or slightly smaller than, an outer diameter of housing 302, 402" of respective conductors 300, 400" such that a press or friction fit, for example, may be used to assist in retaining conductors 300, 400" within respective apertures 548 of socket member 544. Respective apertures 549 in retainer 546 may or may not likewise be roughly equal to, or slightly smaller than, an outer diameter of housing 302, 402" of respective conductors 300, 400" such that a press or friction fit, for example, may be used to assist in retaining conductors 300, 400" within respective apertures 549 of retainer 546.

Also, aperture 548 of socket member 544 of carrier 542 may have a diameter that may be larger than an outer diameter of housing 402' of conductor 400' such that an annular gap may be defined between conductor 400' and respective aperture 548 of socket member 544. Respective aperture 549 may then be roughly equal to, or slightly smaller than, an outer diameter of the lower portion of housing 402', to assist in retaining conductor 400' within respective aperture 549 of retainer 546. In this exemplary embodiment, when conductors 300, 400', 400", for example, engage respective upper and lower contacts 252, 452, 506; 508 and are compressed, the respective beams/tongs 330, 430', 430" may be adapted to bow outwardly within apertures 548 instead of, or in addition to, the spreading apart of beams/tongs 330, 430' 430" proximate deformation 308, 408', 408". For this embodiment, beams/tongs 330, 430', 430" may be biased outwardly upon assembly to encourage/facilitate this beam/tong bowing upon compression. Conductor 200 may also adapted for such beam/tong 230 bowing upon compression.

As noted above, electrical conductors 300, 400', 400" may be press or friction fit within respective apertures 548, 549 of socket member 544 and retainer plate 546 of carrier 542 such that electrical conductors 300, 400', 400" may be retained within apertures 548, 549 while permitting: (1) the upper end of tongs 330 to flex, or be biased against, the upper enlarged portion 322 of plunger pin structure 304 when engaging/ engaged/disengaging with package 502; and (2) the respective interior surfaces 460', 460" of the upper ends of housings 402', 402" to flex, or be biased, against contacts 452, 506 when engaging/engaged/disengaging with package 502; and B the respective opposing end 122, lower (tapered) surface 434', lower surface 434" of conductors 300, 400', 400" to engage contacts 508 of load board 504.

Retainer 546 of depicted carrier 542 may be made from a non-conductive material, such as polytetrafluoroethylene (PTFE) for example, to provide for receipt/sliding receipt of the lower portions of conductors 300, 400', 400" without jeopardizing the electrical pathways defined through conductors 300, 400', 400". Socket member 544 of carrier 542 may be made from non-conducive materials, such as polytetrafluoroethylene (PTFE) for example, to provide for the receipt/sliding receipt of the upper portions of conductors 300, 400', 400" without jeopardizing the electrical pathways defined through conductors 300, 400', 400". It is contemplated that carrier 542 may be a one piece carrier having respective single apertures, corresponding to aligned apertures 548, 549, for receipt of electrical conductors 300, 400', 400".

Interconnect assembly 500 specifically illustrated in FIG. 5, for example, has only three conductors 300, 400', 400" spaced across carrier 542 to facilitate description. It should be understood, however, that an interconnect assembly according to the invention may include an arrangement of conductors that includes few conductors or, alternatively, up to tens of thousands of conductors or more. It is also noted that as one skilled in the art would recognize and understand, the above description of FIG. 5 and the retention of conductors 300, 400', 400" within carrier 542 would apply to the other exemplary embodiment of conductors 100, 200.

The present invention may be embodied in other specific forms without departing from the spirit or essential attributes thereof. Although the invention has been described and illustrated with respect to the exemplary embodiment thereof, it should be understood by those skilled in the art that the foregoing and various other changes, omissions and additions may be made therein and thereto, without parting from the spirit and scope of the present invention.

The invention claimed is:

1. An interconnect assembly electrically connecting two circuit members, which include respective arrays of electrical contacts for engagement with the interconnect assembly, the interconnect assembly comprising:

a plurality of electrical conductors arranged in a spaced arrangement substantially corresponding to a spaced arrangement for the respective arrays of electrical contacts to provide contact between the conductors and the contact arrays, wherein the plurality of electrical conductors comprises;
 a first electrical conductor, the first electrical conductor being a stamped collet spring pin assembly,
 a second electrical conductor, the second electrical conductor being a direct contact collet spring assembly, and
 a third electrical conductor, the third electrical conductor being a direct contact stamped collet spring assembly; and
a carrier including:
 a socket member including a plurality of apertures each receiving an upper portion of one of the plurality of conductors wherein the socket member includes a first aperture that has a diameter larger than an outer diameter of a housing of the second conductor so that an annular gap is defined between the second conductor and the first aperture of the socket member; and
 a retainer including a plurality of apertures each receiving a lower portion of one of the plurality of conductors,
 wherein the respective apertures are aligned axially with each other.

2. An interconnect assembly electrically connecting two circuit members, which include respective arrays of electrical contacts for engagement with the interconnect assembly, the interconnect assembly comprising:

a plurality of electrical conductors arranged in a spaced arrangement substantially corresponding to a spaced arrangement for the respective arrays of electrical contacts to provide contact between the conductors and the contact arrays, wherein the plurality of electrical conductors comprises:
 a first electrical conductor, the first electrical conductor being a stamped collet spring pin assembly,
 a second electrical conductor, the second electrical conductor being a direct contact collet spring assembly, and
 a third electrical conductor, the third electrical conductor being a direct contact stamped collet spring assembly,
 wherein each conductor comprises a beam adapted to bow outwardly within the respective apertures when the respective conductor engages the respective array of contacts and is compressed; and
a carrier including:
 a socket member including a plurality of apertures each receiving an upper portion of one of the plurality of conductors; and
 a retainer including a plurality of apertures each receiving a lower portion of one of the plurality of conductors,
 wherein the respective apertures are aligned axially with each other.

3. An interconnect assembly electrically connecting two circuit members, which include respective arrays of electrical contacts for engagement with the interconnect assembly, the interconnect assembly comprising:

a plurality of electrical conductors arranged in a spaced arrangement substantially corresponding to a spaced arrangement for the respective arrays of electrical contacts to provide contact between the conductors and the contact arrays; and a carrier including:
- a socket member including a plurality of apertures each receiving an upper portion of one of the plurality of conductors; and
- a retainer including a plurality of apertures each receiving a lower portion of one of the plurality of conductors, wherein the retainer is made from polytetrafluoroethylene (PTFE),
- wherein the respective apertures are aligned axially with each other.

4. An interconnect assembly electrically connecting two circuit members, which include respective arrays of electrical contacts for engagement with the interconnect assembly, the interconnect assembly comprising:

a plurality of electrical conductors arranged in a spaced arrangement substantially corresponding to a spaced arrangement for the respective arrays of electrical contacts to provide contact between the conductors and the contact arrays; and a carrier including:
- a socket member including a plurality of apertures each receiving an upper portion of one of the plurality of conductors, wherein the socket member is made from polytetrafluoroethylene (PTFE); and
- a retainer including a plurality of apertures each receiving a lower portion of one of the plurality of conductors,
- wherein the respective apertures are aligned axially with each other.

* * * * *